United States Patent
Nakata

(10) Patent No.: US 9,485,892 B2
(45) Date of Patent: Nov. 1, 2016

(54) FLAT WIRING BODY MODULE

(71) Applicant: Yazaki Corporation, Tokyo (JP)

(72) Inventor: Atsushi Nakata, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/950,480

(22) Filed: Nov. 24, 2015

(65) Prior Publication Data

US 2016/0149329 A1  May 26, 2016

(30) Foreign Application Priority Data

Nov. 26, 2014  (JP) ................. 2014-238365

(51) Int. Cl.
| | | |
|---|---|---|
| *H01R 12/78* | (2011.01) | |
| *H05K 9/00* | (2006.01) | |
| *H01B 7/08* | (2006.01) | |
| *H02G 5/06* | (2006.01) | |
| *B60R 16/02* | (2006.01) | |

(52) U.S. Cl.
CPC ........ *H05K 9/00* (2013.01); *H01B 7/08* (2013.01); *H02G 5/06* (2013.01); *B60R 16/0207* (2013.01)

(58) Field of Classification Search
CPC .... H01R 12/592; H01R 12/78; H01R 12/68; H01B 7/0045; B60R 16/0207
USPC ........................................ 439/489; 174/72 A
See application file for complete search history.

(56) References Cited

U.S. PATENT DOCUMENTS

| | | | | | |
|---|---|---|---|---|---|
| 3,873,172 | A | * | 3/1975 | Paullus ................ | H01R 12/778 439/498 |
| 4,674,819 | A | * | 6/1987 | Fujitani ................ | H01R 12/675 439/404 |
| 4,959,030 | A | * | 9/1990 | Tatebe ................... | H01R 13/56 439/493 |
| 6,031,727 | A | * | 2/2000 | Duesman ............. | H05K 1/0207 165/185 |
| 7,145,073 | B2 | * | 12/2006 | Sexton .................... | G06K 7/00 174/110 R |
| 7,557,298 | B2 | * | 7/2009 | Vanhoutte .............. | H02G 5/005 174/149 B |
| 8,278,553 | B2 | * | 10/2012 | Suzuki ................ | B60R 16/0215 174/254 |
| 2004/0127092 | A1 | * | 7/2004 | Yamada ............. | H01R 12/7064 439/498 |
| 2005/0230146 | A1 | * | 10/2005 | Koyama ........... | H01L 23/49822 174/255 |
| 2005/0265650 | A1 | * | 12/2005 | Priyadarshi .......... | G02B 6/4201 385/14 |
| 2006/0207779 | A1 | * | 9/2006 | Sexton ................. | H01B 7/0216 174/36 |
| 2008/0042284 | A1 | * | 2/2008 | Naruse ................. | H01L 27/0207 257/758 |
| 2012/0302075 | A1 | * | 11/2012 | Muraoka .............. | H05K 1/0251 439/78 |
| 2013/0020122 | A1 | * | 1/2013 | Su ......................... | H05K 9/0098 174/350 |
| 2013/0206928 | A1 | | 8/2013 | Murakoshi et al. | |
| 2013/0341072 | A1 | * | 12/2013 | Lin ....................... | H05K 1/148 174/254 |
| 2015/0092374 | A1 | * | 4/2015 | Isaacs ................. | H05K 1/0206 361/767 |

FOREIGN PATENT DOCUMENTS

JP       2012-55105 A    3/2012

* cited by examiner

*Primary Examiner* — Gary Paumen
(74) *Attorney, Agent, or Firm* — Sughrue Mion, PLLC

(57) ABSTRACT

A flat wiring body module includes a flat wiring body, a containing member containing the flat wiring body, and a connector part. The flat wiring body includes a flat wiring body for power including a power circuit and a first flat board, a flat wiring body for non-power including a non-power circuit and a second flat board, and a flat wiring body for ground including a ground and a third flat board. The flat wiring body for power, the flat wiring body for non-power, and the flat wiring body for ground are stacked in a state where the flat wiring body for ground is arranged between the flat wiring body for power and the flat wiring body for non-power.

2 Claims, 5 Drawing Sheets

FLAT WIRING BODY MODULE

CROSS REFERENCE TO RELATED APPLICATION

This application is based on Japanese Patent Application (No. 2014-238365) filed on Nov. 26, 2014, the contents of which are incorporated herein by reference. Also, all the references cited herein are incorporated as a whole.

BACKGROUND

1. Technical Field

The present invention relates to a flat wiring body module provided with a flat wiring body which is formed by stacking a plurality of wiring bodies.

2. Background Art

Conventionally, a wire harness has been arranged in an instrument panel of a motor car. Generally, this wire harness is arranged along a reinforcing metal pipe. The wire harness is formed by bundling a plurality of electric wires into a substantially round shape in cross section. In arranging the wire harness as described above, a relatively large protector capable of containing the wire harness has been used (Refer to JP-A-2012-55105).

In JP-A-2012-55105, there is such a problem that in case where a diameter of the wire harness grows larger following an increase of circuits in number, for example, it is necessary to secure a large space for arranging the wire harness according to the diameter. Moreover, in the above described prior art, there is a further problem, as described below. Since the wire harness is formed by bundling a plurality of the electric wires, wires for power and wires for signals, for example, may be positioned close to each other, in some cases, and therefore, noises of the wires for power are transmitted to the wires for signals, which becomes a cause for cross talk.

SUMMARY

The present disclosure has been made in view of the above described circumstances, and an object of the disclosure is to provide a flat wiring body module capable of achieving space saving, and at the same time, capable of being hardly affected by noises.

In order to achieve the object, the flat wiring body module according to the disclosure including a flat wiring body, a containing member formed of resin for containing the flat wiring body, and a connector part configured to connect a mating member, wherein the flat wiring body includes: a flat wiring body for power including a power circuit which may serves as a noise source or a noise passage, and a first flat board in which the power circuit is provided; a flat wiring body for non-power including a non-power circuit in which an influence of a noise is to be avoided, and a second flat board in which the non-power circuit is provided; and a flat wiring body for ground including a ground and a third flat board in which the ground is provided; and wherein the flat wiring body for power, the flat wiring body for non-power, and the flat wiring body for ground are stacked in a state where the flat wiring body for ground is arranged between the flat wiring body for power and the flat wiring body for non-power.

By the above configuration, because the flat wiring body formed by stacking the flat wiring body for power, the flat wiring body for non-power, and the flat wiring body for ground is adopted, it is possible to cope with the problem of space, by enhancing density of the circuits on the board, even though the number of the circuits increases, and hence, space saving can be achieved. Moreover, according to the disclosure, because the flat wiring body for ground is interposed between the flat wiring body for power and the flat wiring body for non-power, it is possible to avoid influences of noises on the circuit for non-power, by the presence of the flat wiring body for ground, even in case where the circuit for power becomes a noise source or a noise passage. Further, according to the disclosure, because the flat wiring body for ground is interposed as described above, it is possible to position the circuit for non-power remote from the circuit for power, by a thickness of the flat wiring body for ground.

Therefore, according to the disclosure, such an advantage that it is possible to save the space, and at the same time, to be hardly affected by influences of noises is achieved. Additionally, according to the disclosure, because the flat wiring body having the above described structure is adopted, such an advantage that it is possible to enhance freeness in designing is achieved.

For example, the flat wiring body further comprises another flat wiring body for ground; and the flat wiring body for non-power is arranged between the flat wiring body for ground and the another flat wiring body for ground.

According to the above configuration, because the flat wiring body for non-power is interposed between a plurality of the flat wiring bodies for ground, such an advantage that it is possible to avoid the influences of noises from the circuit for power, and besides, to avoid influences of noises from an exterior of the flat wiring body module too is achieved.

DETAILED DESCRIPTION OF THE EXEMPLARY EMBODIMENTS

A flat wiring body module includes a flat wiring body which is formed by stacking a plurality of wiring bodies, a containing member for containing this flat wiring body, and a connector part for external connection. As the wiring bodies in the flat wiring body as described above, there are a flat wiring body for power, a flat wiring body for non-power, and a flat wiring body for ground. These wiring bodies are stacked at least in such a manner that the flat wiring body for ground is interposed between the flat wiring body for power and the flat wiring body for non-power. As the member for containing the flat wiring body in a more favorable manner, a case formed of resin or a corrugate tube and so on are recommended.

Embodiments

Figure 1:
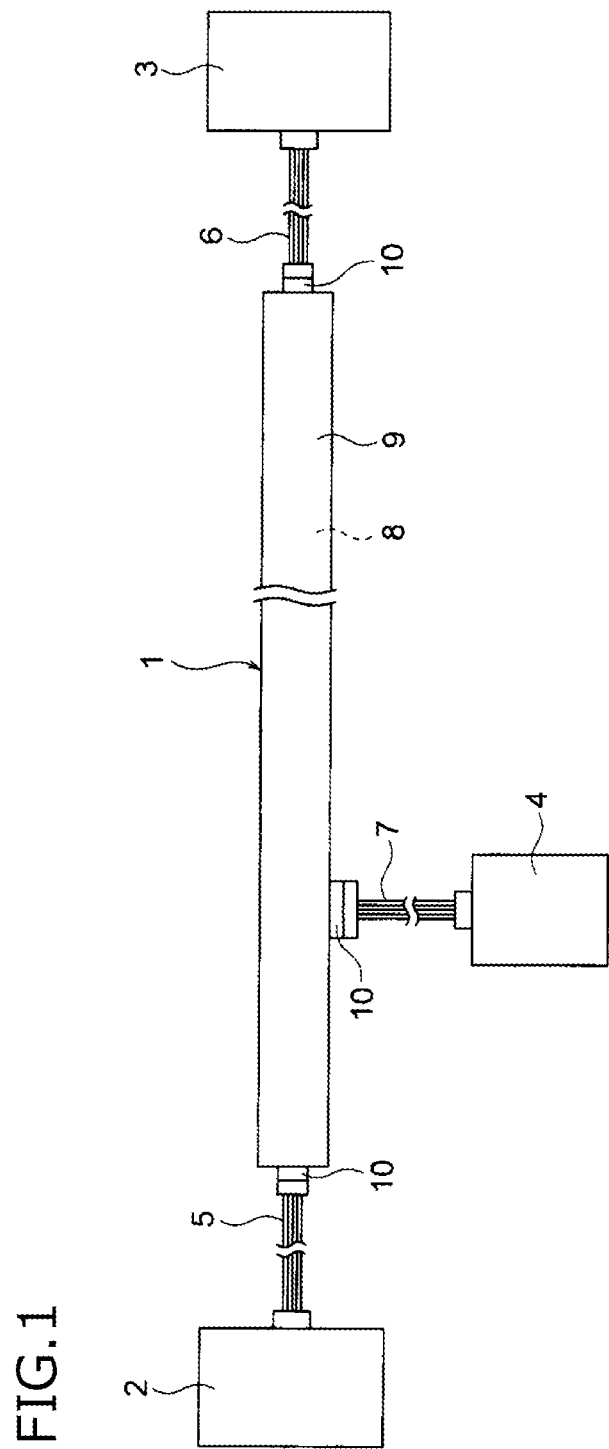
FIG. 1 is a schematic view showing a flat wiring body module according to the disclosure, in an installed state.
Figure 2:
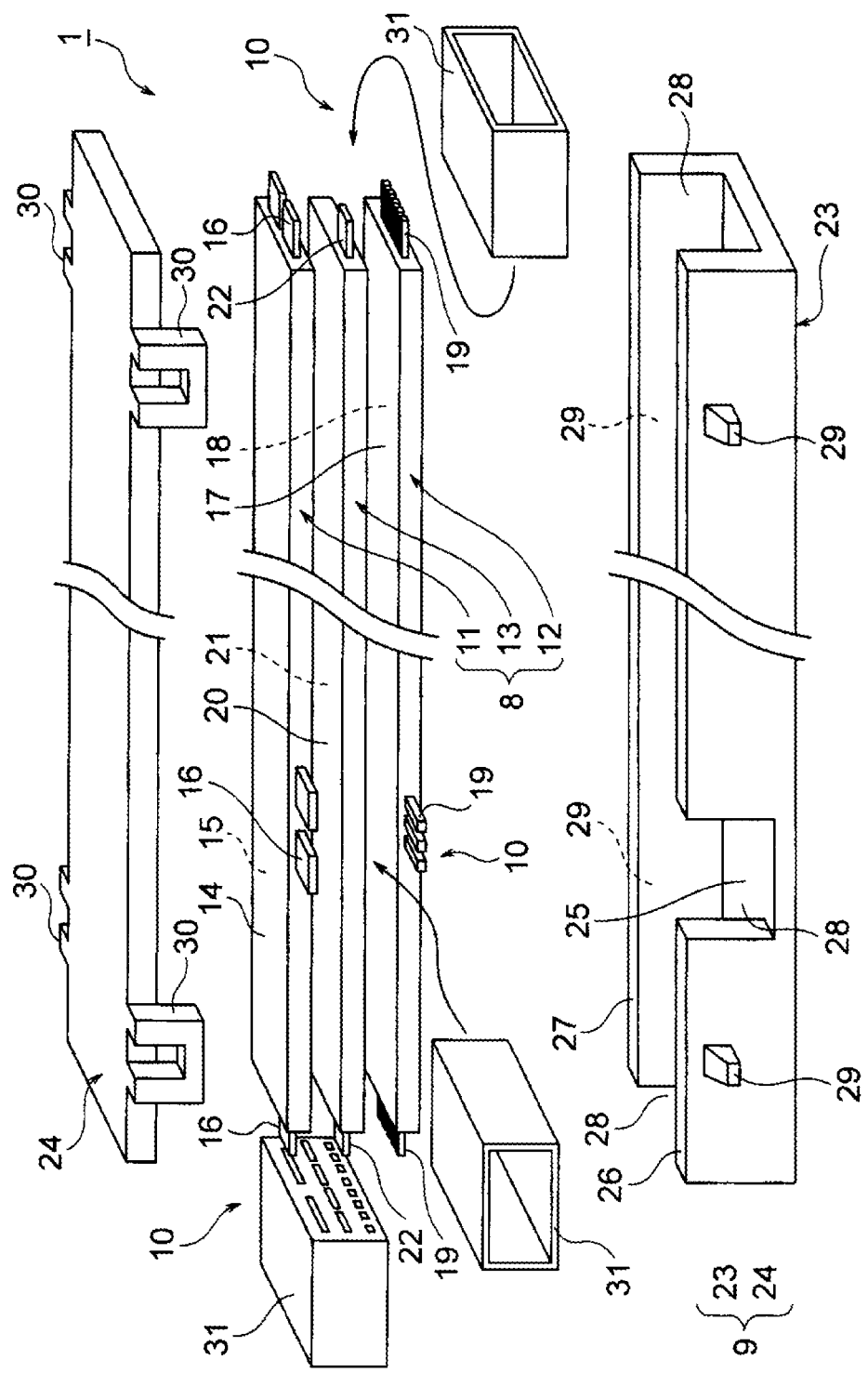
FIG. 2 is an exploded perspective view of the flat wiring body module in FIG. 1.
Figure 3:
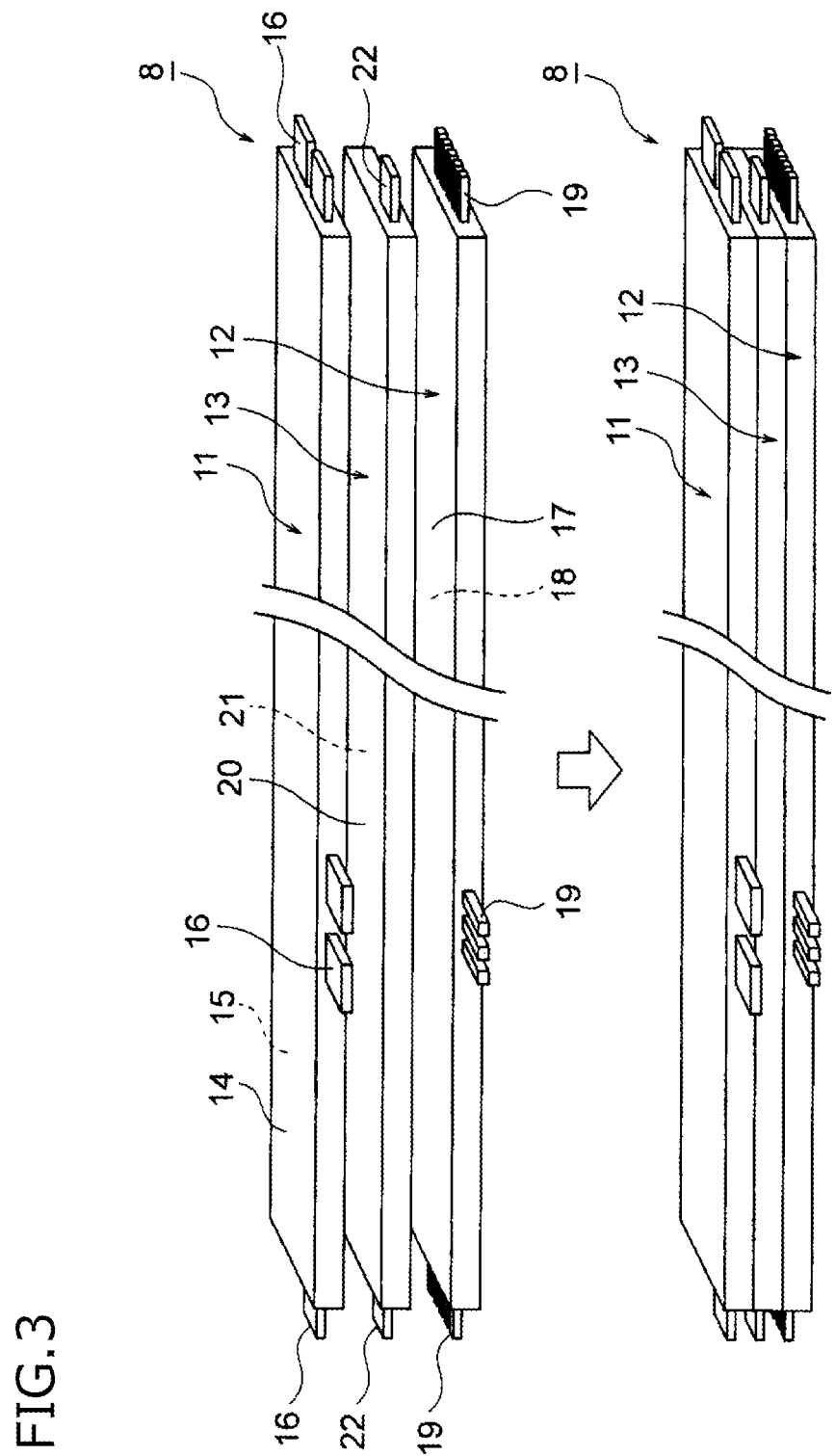
FIG. 3 is an exploded perspective view and a perspective view of a flat wiring body in FIG. 2.
Figure 4:
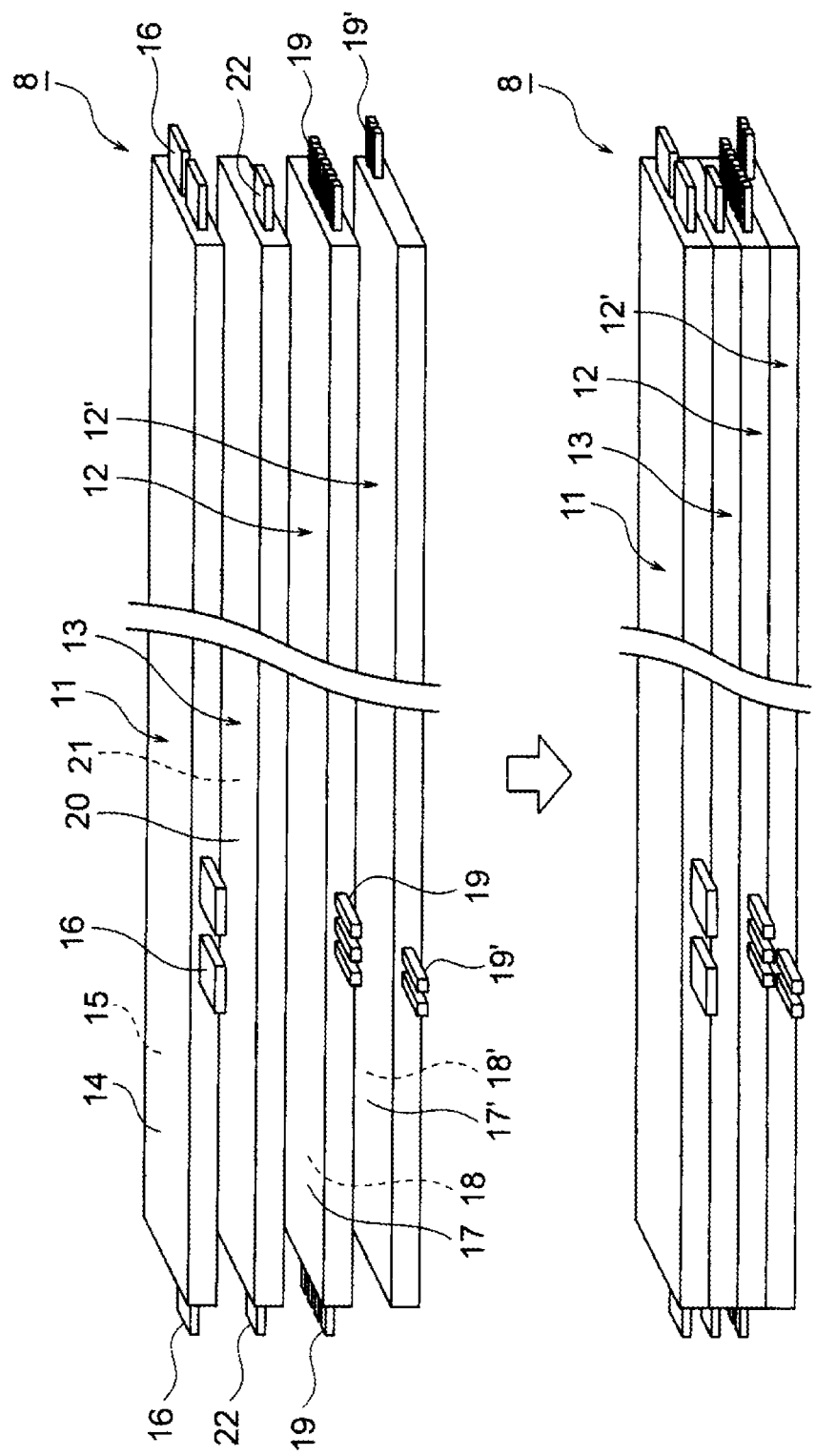
FIG. 4 is an exploded perspective view and a perspective view of a flat wiring body in another example.
Figure 5:
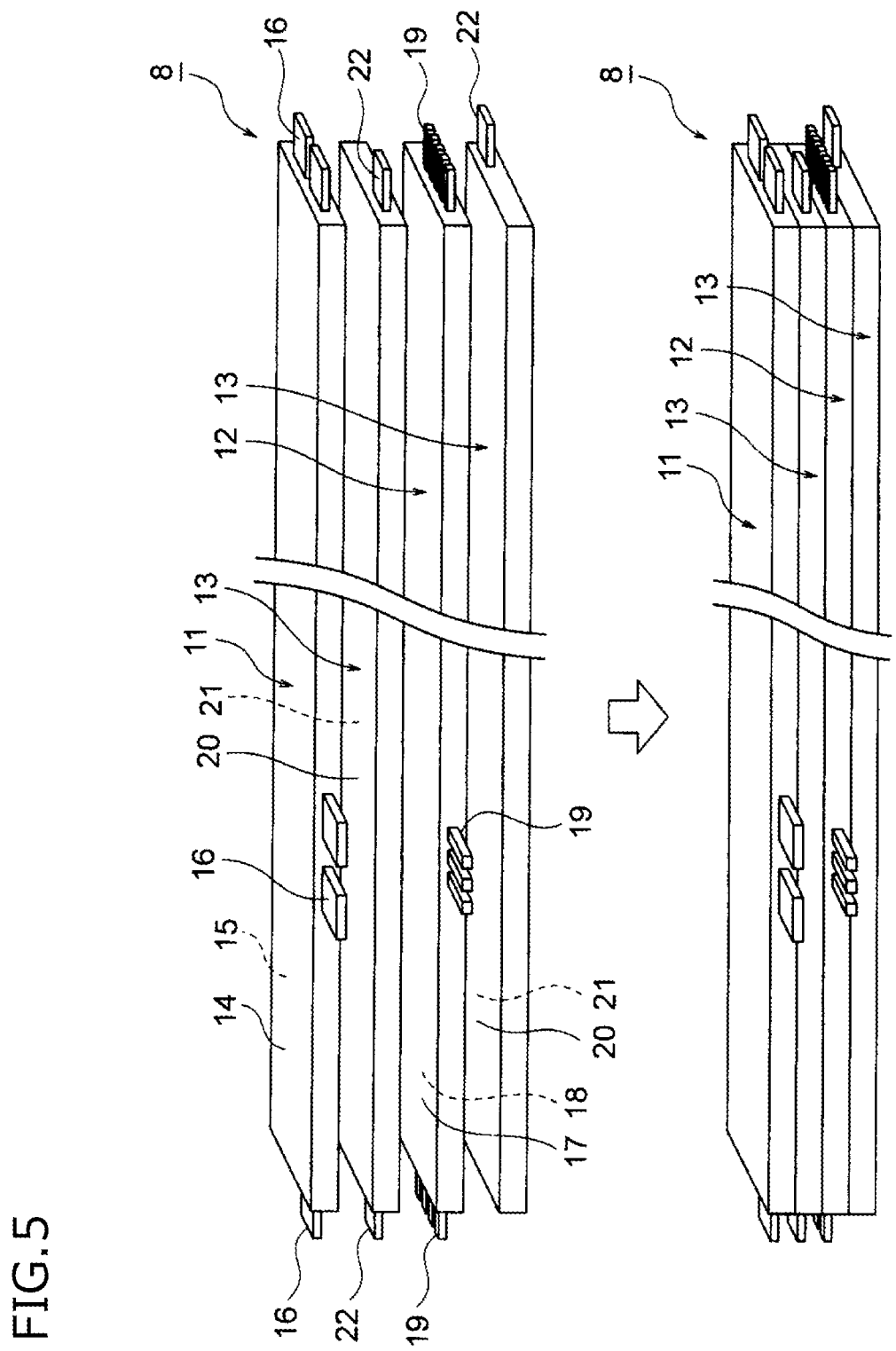
FIG. 5 is an exploded perspective view and a perspective view of a flat wiring body in still another example.

Several embodiments will be described below, referring to the drawings. FIG. 1 is a schematic view showing the flat wiring body module according to the disclosure, in an installed state. Moreover, FIG. 2 is an exploded perspective view of the flat wiring body module in FIG. 1, and FIG. 3 is an exploded perspective view and a perspective view of a flat wiring body in FIG. 2. Further, FIGS. 4 and 5 are exploded perspective views and perspective views of flat wiring bodies in other examples.

In FIG. 1, reference numeral 1 represents the flat wiring body module according to the disclosure. In this embodiment, this flat wiring body module 1 is used as a substitute for the wire harness in the prior art. Specifically, the flat wiring body module 1 is arranged along a reinforcing metal pipe in an instrument panel of a motor car (as one example, but may be also arranged, for example, in a side shell of the motor car). In this embodiment, the flat wiring body module 1 is disposed between an electronic control unit 2 and auxiliary devices 3, 4.

Reference numeral 5 in FIG. 1 represents a connecting member (a short wire harness) for electrically connecting the flat wiring body module 1 to the electronic control unit 2. Moreover, reference numerals 6, 7 also represent connecting members (short wire harnesses) for electrically connecting the flat wiring body module 1 to the auxiliary devices 3, 4 in the same manner.

It is to be noted that there are other auxiliary devices besides the auxiliary devices 3, 4, and these other auxiliary devices may be also connected to the flat wiring body module 1.

In FIGS. 1 and 2, the flat wiring body module 1 includes a flat wiring body 8, a case 9 formed of resin (a containing member) for containing this flat wiring body 8, and a plurality of connector parts 10 for external connection. As will be understood from the following description, this flat wiring body module 1 is formed in a more compact shape than the wire harness which is contained in a protector in the prior art. Moreover, the flat wiring body module 1 is formed in such a manner that, even in case where the number of circuits increases, the increase can be coped with.

In FIGS. 2 and 3, the flat wiring body 8 includes a flat wiring body 11 for power, a flat wiring body 12 for non-power, and a flat wiring body 13 for ground. The flat wiring body 8 having the above described structure is formed by stacking the wiring bodies at least in a state where the flat wiring body 13 for ground is interposed between the flat wiring body 11 for power and the flat wiring body 12 for non-power.

In this embodiment, the flat wiring body 8 is formed in a shape of a band (a rectangular shape in which a longer side is remarkably elongated as compared with a shorter side), as seen in a plan view. Because the flat wiring body 8 has the shape of a band, the flat wiring body 11 for power, the flat wiring body 12 for non-power, and the flat wiring body 13 for ground composing the flat wiring body 8 are also formed in a shape of a band. It is to be noted that this shape is only an example, and they can be formed in appropriate shapes (for example, a crank shape, an L-shape, and so on), taking an arranging route into consideration.

The flat wiring body 11 for power includes a first board 14 and a circuit 15 for power. The first board 14 is formed of insulating material. Moreover, the first board 14 is so formed as to be isolated from the circuits of the other wiring bodies. The first board 14 is formed in a shape of a band whose front and back faces (upper and lower faces) are flat. In short, the first board 14 is formed in a flat shape. The first board 14 as described above is formed having a predetermined thickness.

The circuit 15 for power includes one or a plurality of circuits for power which are formed in a desired pattern, and corresponds to the circuit which can be a noise source or a noise passage. As the circuit 15 for power, a bus bar or a flat conductor which is publicly known is adopted. The circuit 15 for power is provided in such a manner that a main body thereof is embedded in the first board 14 (as one example, but not particularly limited, provided that the circuit 15 can be isolated from the circuits of the other wiring bodies).

A part of the circuit 15 for power which is protruded from an end of the first board 14 is formed as a terminal 16 for external connection. The terminal 16 is a part for constituting the connector part 10. In this embodiment, the terminal 16 is formed in a shape of a tab. It is to be noted that the terminal 16 need not be formed in such a manner as described in this embodiment. For example, it is possible to prepare a separate component as the terminal, and to attach this terminal afterward (Terminals 19, 22 which will be described below may be also prepared in the same manner).

The flat wiring body 12 for non-power includes a second board 17 and a circuit 18 for non-power. The second board 17 is formed in a substantially same manner as the first board 14. Specifically, the second board 17 is formed of insulating material. Moreover, the second board 17 is so formed as to be isolated from the circuits of the other wiring bodies. The second board 17 is formed in a shape of a band whose front and back faces (upper and lower faces) are flat. In short, the second board 17 is formed in a flat shape. The second board 17 as described above is formed having a predetermined thickness (the same thickness as the first board 14, in this embodiment).

The circuit 18 for non-power includes one or a plurality of circuits which are formed in a desired pattern, and corresponds to the circuit for non-power in which influences of noises are to be avoided. As the circuit 18 for non-power, a bus bar or a flat conductor which is publicly known is adopted. The circuit 18 for non-power is provided in such a manner that a main body thereof is embedded in the second board 17 (as one example, but not particularly limited, provided that the circuit 18 can be isolated from the circuits of the other wiring bodies).

A part of the circuit 18 for non-power which is protruded from an end of the second board 17 is formed as a terminal 19 for external connection. The terminal 19 is a part for constituting the connector part 10. In this embodiment, the terminal 19 is formed in a shape of a pin (as one example).

It is to be noted that a plurality of the circuit 18 for non-power (denoted with dashed numerals) may be provided, as shown in FIG. 4. In case where there are a number of circuits for non-power in which influences of noises are to be avoided, such a structure as shown in FIG. 4 had better be adopted, and this structure is effective, of course.

The flat wiring body 13 for ground includes a third board 20 and a ground 21 (also called as a GND or a ground). The third board 20 is formed in a substantially same manner as the first board 14 and the second board 17. Specifically, the third board 20 is formed of insulating material. Moreover, the third board 20 is so formed as to be isolated from the circuits of the other wiring bodies. The third board 20 is formed in a shape of a band whose front and back faces (upper and lower faces) are flat. In short, the third board 20 is formed in a flat shape. The third board 20 as described above is formed having a predetermined thickness (the same thickness as the first board 14 and the second board 17, in this embodiment).

The ground 21 includes one or a plurality of circuits which are formed in a desired pattern, and is so formed as capable of exerting well-known functions of the ground. As the ground 21, a bus bar or a flat conductor which is publicly known is adopted. Alternatively, a sheet metal or a metal foil may be adopted. The ground 21 is provided in such a manner that a main body thereof is embedded in the third board 20 (as one example, but not particularly limited, provided that the ground 21 can be isolated from the circuits of the other wiring bodies). For example, a sheet metal or a metal foil may be attached to a back face of the third board 20.

A part of the ground 21 which is protruded from an end of the third board 20 is formed as a terminal 22 for external connection. The terminal 22 is a part for constituting the connector part 10. In this embodiment, the terminal 22 is formed in a shape of a tab having a narrow width.

The flat wiring body 13 for ground is interposed between the flat wiring body 11 for power and the flat wiring body 12 for non-power. In other words, a part for exerting function of the ground is interposed between the flat wiring body 11 for power and the flat wiring body 12 for non-power.

It is to be noted that a plurality of the flat wiring bodies 13 for ground (denoted with dashed numerals) may be provided, as shown in FIG. 5, so that the flat wiring body 12 for non-power is interposed between them. In case where influences of noises from the exterior are to be avoided, such a structure as shown in FIG. 5 may be adopted. It is apparent that this structure is effective.

In FIG. 2, the case 9 is a component formed of resin for containing the flat wiring body 8, as described above, and includes a case body 23 and a lid body 24. The case 9 is formed in conformity with the shape of the flat wiring body 8.

The case body 23 is formed in a shape of a trough having a bottom wall 25 and a pair of side walls 26, 27. Connector mounting parts 28, 28 are formed at both ends of the case body 23 in a longitudinal direction. The connector mounting part 28 is formed on the side wall 26 too. Each of the connector mounting parts 28 is formed in an open shape, as the part for mounting a connector housing 31 of the connector part 10, which will be described below. It is to be noted that the connector housing 31 may be integrally formed with the case 9 so that the case 9 has a function of the connector part 10. In this disclosure, the connector housing 31 and the case 9 may be formed either integrally or separately, provided that they can be connected to the exterior.

The side walls 26, 27 are provided with a plurality of locking projections 29. These locking projections 29 are formed as parts for locking the lid body 24.

The lid body 24 is formed in a shape of a band capable of covering an open part on an upper face of the case body 23. The lid body 24 having such a shape is provided with a plurality of locking arms 30 which are adapted to be locked to the locking projections 29 of the case body 23. Each of the locking arms 30 has elasticity, and is so formed as to be locked, when it has run across the locking projection 29.

Although, in this embodiment, the case 9 is adopted as the member formed of resin for containing the flat wiring body 8, this is not necessarily essential, but any other containing member may be adopted. For example, the case 9 may be substituted with a corrugate tube which is formed of resin into a shape of an accordion pipe. Moreover, a heat-shrinkable tube may be used.

The connector part 10 is provided for the purpose of connecting the flat wiring body 8 to the electronic control unit 2, the auxiliary devices 3, 4, and so on. The connector part 10 includes the terminals 16, 19, 22, and the insulating connector housing 31. The connector part 10 in this embodiment is formed by inserting the terminals 16, 19, 22 into the connector housing 31 from a rear side (as one example, but not particularly limited).

In the above described structure, the flat wiring body 8 is formed by stacking the flat wiring bodies 11, 12, 13, in a state where the flat wiring body 13 for ground is interposed between the flat wiring body 11 for power and the flat wiring body 12 for non-power, and then, by fixing them by appropriate means. Thereafter, a plurality of the connector parts 10 for external connection are mounted on this flat wiring body 8, and contained in the case 9. In this manner, assembling of the flat wiring body module 1 according to the disclosure is completed.

According to the flat wiring body module 1, because the flat wiring body 8 having the above described structure is adopted, it is possible to cope with the increase of the number of the circuits, by enhancing density of the circuits on the board, and hence, space saving can be achieved.

Moreover, according to the flat wiring body module 1, because the flat wiring body 13 for ground is interposed between the flat wiring body 11 for power and the flat wiring body 12 for non-power, influences of noises on the circuit 18 for non-power can be avoided by the presence of the flat wiring body 13 for ground, even in case where the circuit 15 for power becomes a noise source or a noise passage. Supplementary description concerning the flat wiring body 12 for non-power will be made. The flat wiring body 12 for non-power is a passage for correspondence, for example, and it is apparent that enhanced effects can be obtained, particularly in case of high speed signal transmission, by adopting the flat wiring body 12 for non-power according to the disclosure thereby to avoid the influences of noises, as described above.

Further, according to the flat wiring body module 1, because the flat wiring body 13 for ground is interposed as described above, it is possible to position the circuit 18 for non-power remote from the circuit 15 for power, by the thickness of the flat wiring body 13 for ground.

Therefore, according to the disclosure, such an advantage that it is possible to save the space, and at the same time, to be hardly affected by the influences of noises is achieved.

Further, according to the disclosure, because the flat wiring body 8 having the above described structure is adopted, such an advantage that it is possible to enhance freeness in designing is achieved.

It is apparent that the disclosure can be carried out in various modifications within a scope not deviating from the gist of the disclosure.

What is claimed is:

1. A flat wiring body module comprising:
   a flat wiring body;
   a containing member formed of resin for containing the flat wiring body; and
   a connector part configured to connect a mating member,
   wherein the flat wiring body comprises:
      a flat wiring body for power comprising a power circuit which may serves as a noise source or a noise passage, and a first flat board in which the power circuit is provided;
      a flat wiring body for non-power comprising a non-power circuit in which an influence of a noise is to be avoided, and a second flat board in which the non-power circuit is provided; and
   a flat wiring body for ground comprising a ground and a third flat board in which the ground is provided; and
   wherein the flat wiring body for power, the flat wiring body for non-power, and the flat wiring body for ground are stacked in a state where the flat wiring body for ground is arranged between the flat wiring body for power and the flat wiring body for non-power.

2. The flat wiring body module according to claim 1, wherein the flat wiring body further comprises another flat wiring body for ground; and wherein the flat wiring body for non-power is arranged between the flat wiring body for ground and the another flat wiring body for ground.

\* \* \* \* \*